(12) United States Patent
Appelt et al.

(10) Patent No.: US 6,391,210 B2
(45) Date of Patent: May 21, 2002

(54) PROCESS FOR MANUFACTURING A MULTI-LAYER CIRCUIT BOARD

(75) Inventors: Bernd K. Appelt, Endicott; John M. Lauffer, Waverly; Voya R. Markovich, Endwell; Irving Memis, Vestal; David J. Russell, Apalachin, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/901,848

(22) Filed: Jul. 9, 2001

Related U.S. Application Data

(62) Division of application No. 09/283,679, filed on Apr. 1, 1999, now Pat. No. 6,290,860.

(51) Int. Cl.⁷ .............................................. H01B 13/00
(52) U.S. Cl. ......................... 216/13; 216/17; 264/400; 264/40.1; 430/311; 430/314; 438/15; 438/618; 219/121.71
(58) Field of Search ............................... 264/400, 40.1; 430/311, 314; 438/15, 618; 291/829, 846; 216/13, 17, 20; 219/121.7

(56) References Cited

U.S. PATENT DOCUMENTS

| 5,264,325 A | 11/1993 | Allen et al. ................. 430/280 |
| 5,367,143 A | 11/1994 | White, Jr. ............... 219/121.68 |
| 5,418,689 A | 5/1995 | Alpaugh et al. ............. 361/792 |
| 5,665,650 A | 9/1997 | Lauffer et al. ................. 216/20 |
| 5,670,750 A | 9/1997 | Lauffer et al. ............... 174/262 |
| 5,679,444 A | 10/1997 | Davis et al. ................. 428/209 |
| 5,685,070 A | 11/1997 | Alpaugh et al. ............... 29/840 |
| 5,928,839 A | 7/1999 | Rath et al. ................... 430/313 |
| 5,932,290 A | * 8/1999 | Lombardi et al. ........ 427/372.2 |
| 5,948,526 A | * 9/1999 | Wilheim et al. ............ 428/352 |
| 5,962,815 A | * 10/1999 | Lan et al. .................... 174/262 |
| 6,080,668 A | 1/2000 | Lauffer et al. ............... 430/666 |
| 6,107,109 A | * 8/2000 | Akram et al. ................. 438/15 |

FOREIGN PATENT DOCUMENTS

| GB | 2307351 A | 5/1997 |
| GB | 2328322 | 9/1999 |
| JP | 87138174 | 6/1987 |
| JP | 89305408 | 11/1989 |
| JP | 7115278 | 5/1995 |

OTHER PUBLICATIONS

"Combined Laser Processing of Vias and Circuitry in Plex–Circuits" by E. Roth, R. Vollmer, G. Wolbold & W. Zapka, IBM Tech. Discl. Bulletin. vol. 38 No. 5, May, 1995. pp. 607–608.

"Process for the Photofabrication of Printed Circuit Boards" by Angelo, Gelorme, Gotro Kuczynski, Lawrence, and Russel. IBM Tech. Discl. Bulletin. vol. 30 No. 11, Apr., 1988. pp. 483–484.

* cited by examiner

*Primary Examiner*—Randy Gulakowski
*Assistant Examiner*—M. Kornakov
(74) *Attorney, Agent, or Firm*—Ratner & Prestia; Lawrence R. Fraley, Esq.

(57) ABSTRACT

A circuit board having a structure including a permanent photoimageable dielectric material suitable for fabrication of vias both by laser ablation, plasma ablation, or mechanical drilling techniques and by photoimaging techniques. A process is also disclosed for the manufacture of a multi-level circuit on a substrate having a first-level circuitry pattern on at least one side. The process comprises applying a permanent photoimageable dielectric over the first-level circuitry pattern; exposing the permanent photoimageable dielectric to radiation; laminating a conductive metal layer to the dielectric; making holes in the conductive metal layer and dielectric by mechanical drilling or by laser or plasma ablation; and making a second-level circuitry pattern and filling the holes with a conductive material to electrically connect the first and second layers of circuitry. A further process is claimed for designing a multi-level circuit board product comprising making a prototype having the above structure in which the holes are manufactured by mechanical drilling or by laser or plasma ablation, evaluating the prototype, and then manufacturing a commercial circuit board having essentially the same structure and materials of construction as the prototype, but wherein the holes are manufactured by photoimaging techniques.

21 Claims, 3 Drawing Sheets

PROCESS FOR MANUFACTURING A MULTI-LAYER CIRCUIT BOARD

This application is a divisional of U.S. patent application Ser. No. 09/283,679, filed on Apr. 1, 1999 and issued on Sep. 18, 2001 as U.S. Pat. No. 6,290,860.

TECHNICAL FIELD

The present invention relates generally to external circuits on multi-layer printed circuit boards and, more specifically, to external circuit layers on multi-layer printed circuit boards on top of thin dielectric layers, and to the manufacture of such devices.

BACKGROUND OF THE INVENTION

Current processes for producing external circuit layers on printed circuit boards (PCBs), particularly applications requiring thin dielectric layers, tend to produce external circuit layers that are non-planarized or wavy. In the case of circuitry manufactured by sequential build-up technology, the standard dielectric application techniques provide only incomplete planarization of the underlying circuits.

For instance, referring to FIG. 1, there is shown a conventional printed circuit board 10 having a substrate 12. Substrate 12 may comprise a material such as prepreg (fiberglass coated with a dielectric such as an epoxy). A first circuit pattern 14 is disposed on the surface of substrate 12. Dielectric layer 16 applied over first circuit pattern 14 leaves ridges 18 and valleys 19 created by the circuit pattern 14 underneath dielectric layer 16. A copper foil layer 20 placed over the top of dielectric layer 16 has corresponding ridges 18' and valleys 19'.

In addition, the copper foil layer 20 may only marginally adhere to dielectric layer 16. Both the ridges 18' in the copper foil layer 20 and the marginal adherence may negatively impact the ability to define fine-line circuitry on the copper foil layer 20. Fine-line circuitry may be connected between layers by micro-vias—very small holes containing conductive material. Micro-vias are commonly manufactured either by photoimaging techniques, laser or plasma ablation, or mechanical drilling. Each technique has certain advantages.

Photoimaging techniques for manufacturing micro-vias are considered less expensive for high volume production. It has previously been demonstrated that photosensitive, cationically polymerizable, epoxy-based resin systems, such as the system sold by Morton Electronic Materials Corporation of Tustin, Calif. under the trade name Morton DynaVia 2000 (formerly Morton LB-404) may be used as permanent photoimageable dielectrics (PID). Such a system is detailed in U.S. Pat. No. 5,264,325 assigned to the assignee of the present invention.

The process for using permanent photoimageable dielectrics generally includes (a) applying the PID, (b) photoimaging vias by exposing the PID to ultraviolet light through a photomask and then developing away unexposed regions with a suitable developer such as butyrolactone or propylene carbonate, (c) curing the PID, (d) roughening the surface, (e) plating a conductive material onto the surface, (f) etching circuitry on top of the conductive material, and (g) finishing the panel by standard techniques known in the art. The panel may have any number of layers of circuitry, in which case steps (a) through (f) may be repeated in sequence as necessary before finishing the panel. During the step of plating with the conductive material, conductive material may seep into the vias to provide an electrical connection between desired levels of circuitry.

It has also been demonstrated that a PID can be laminated onto a substrate and copper foil laminated on top of the PID using conventional lamination presses, as generally described in U.S. Pat. No. 5,665,650 and U.S. Pat. No. 5,670,750, also assigned to the assignee of the present invention. Such a lamination process has demonstrated excellent adhesion of the copper foil to the PID.

Laser or plasma formation of micro-vias is another favorable technique to produce micro-vias quickly and easily. Laser or plasma formation of micro-vias generally comprises laser or plasma ablating the dielectric material that separates the upper and lower layers of circuitry to produce a hole.

Mechanical mechanisms may also be used to drill micro-vias. When mechanical mechanisms are used to make the micro-vias, the mechanical action tends to smear dielectric on the sides of the via. Thus, a further "de-smearing" process may be necessary to remove the smeared dielectric from the walls of the vias before conductive material is placed inside the vias.

A via manufacturing line that uses laser or plasma ablation or mechanical drilling provides the advantage of allowing relatively quick re-tooling for new parts, quick turnaround time for small volumes, a wide choice of materials to be used for the via dielectric layer, and simple processing. Disadvantages include the high capital associated with purchasing laser or plasma imaging tools or mechanical drilling equipment and the low throughput for products having a large number of vias. Traditional materials used as dielectrics in multi-layer circuits having micro-vias formed by laser or plasma ablation or mechanical drilling, such as resin-coated copper and prepreg, are not photoimageable.

Because the laser, plasma, and mechanical micro-via processes are used with different dielectric materials than are used for photoimaging processing, a fabricator cannot use a laser, plasma, or mechanical process to produce low-cost, quick-turnaround prototypes of a potential high-volume product that is intended for future mass-production by photoimaging processes. This test data generated on a prototype having micro-vias produced by a laser, plasma, or mechanical drilling technique is not applicable to a mass-produced product having micro-vias produced by a photoimaging technique, because the prototype and the mass-produced product each have different dielectric materials.

Thus, there remains a need in the field for a manufacturing process for multi-layer circuits whereby the same dielectric material may be used for development of both prototype circuits and mass-produced commercial circuits, in which the prototype micro-vias are created by laser or plasma ablation or mechanical drilling and the mass-produced commercial circuit micro-vias are created by photoimaging techniques.

SUMMARY OF THE INVENTION

The present invention provides a process for manufacture of a multi-layer circuit board on a substrate having a top side and a bottom side and a first-level circuitry pattern on at least one of the sides. The process comprises the steps of:
a) applying a permanent photoimageable dielectric material over the first-level circuitry pattern;
b) exposing the permanent photoimageable dielectric material to radiation;
c) laminating a layer of conductive metal to the dielectric material;
d) making holes in the layer of conductive metal to uncover portions of the dielectric material and making holes in the dielectric material by mechanical drilling or by laser or plasma ablation to uncover portions of the first-level circuitry pattern; and e) making a second-level circuitry pattern on the dielectric material including placing a conductive material in the holes to electrically connect the second layer of circuitry and the first layer of circuitry.

The present invention also provides a process for developing a multi-layer circuit board product in which the first step comprises making a prototype multi-layer circuit board having a structure having a substrate with a top side and a bottom side, a first-level circuitry pattern on at least one of the sides, a permanent photoimageable dielectric material over the first-level circuitry pattern, a conductive metal layer over the dielectric material, a second-level circuitry pattern on the dielectric material, and a plurality of vias containing conductive material that electrically connects the second-level circuitry with the first-level circuitry. The process of making the prototype multi-layer circuit board includes fabricating the vias by laser or plasma ablation or by mechanical drilling.

The second step in the development process comprises evaluating the prototype. The third step comprises making a commercialized multi-layer circuit board having a structure and materials of construction identical to the prototype multi-layer circuit board. The process of making the commercialized multi-layer circuit board includes fabricating the vias by a photoimaging technique.

The present invention also provides a multi-layer circuit board comprising a substrate having a top side and a bottom side; a first-level circuitry pattern on at least one of the sides; a dielectric layer over the first-level circuitry pattern; a conductive metal layer over the dielectric layer; a second-level circuitry pattern on the dielectric; and a plurality of vias containing conductive material that electrically connects the second-level circuitry with the first-level circuitry. The dielectric layer is a permanent photoimageable dielectric material suitable, for fabrication of vias by any one of laser ablation, plasma ablation, mechanical drilling, or photoimaging techniques.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
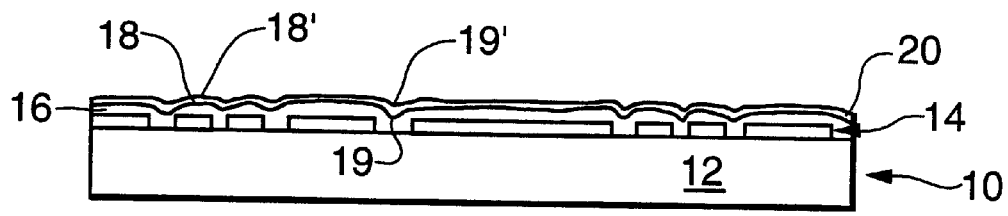
FIG. 1 is a cross-sectional side view illustration of a conventional multi-layer circuit board.
Figure 2:
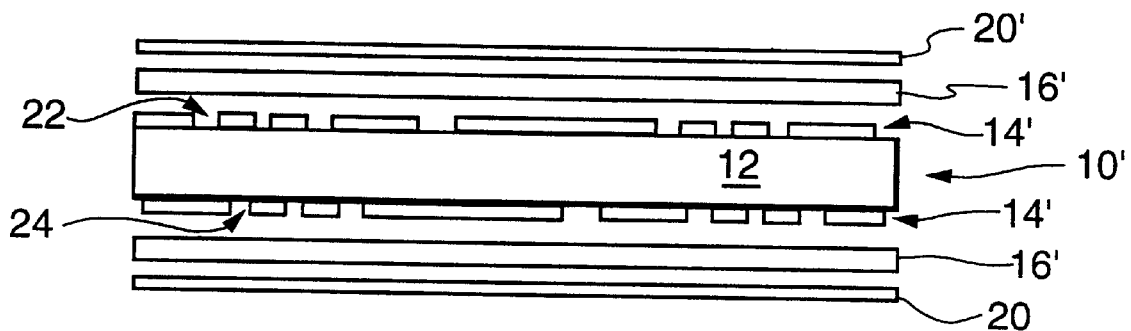
FIG. 2 is an exploded side view, cross-sectional illustration of an exemplary in-process, multi-layer circuit board of the present invention.
Figure 3:
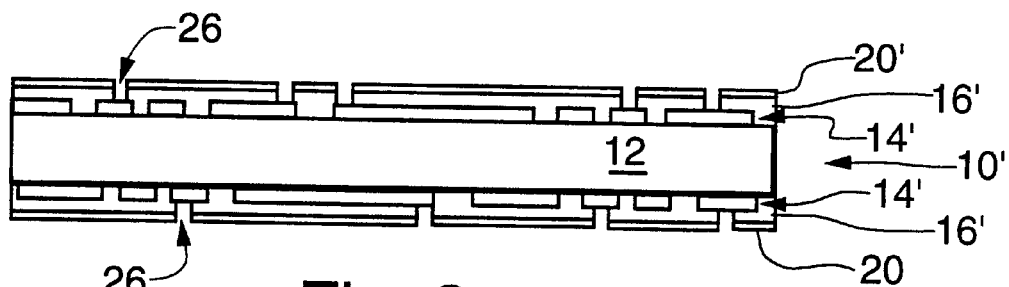
FIG. 3 is an assembled view illustration of the circuit board of FIG. 2 at a later step in the process.
Figure 5:
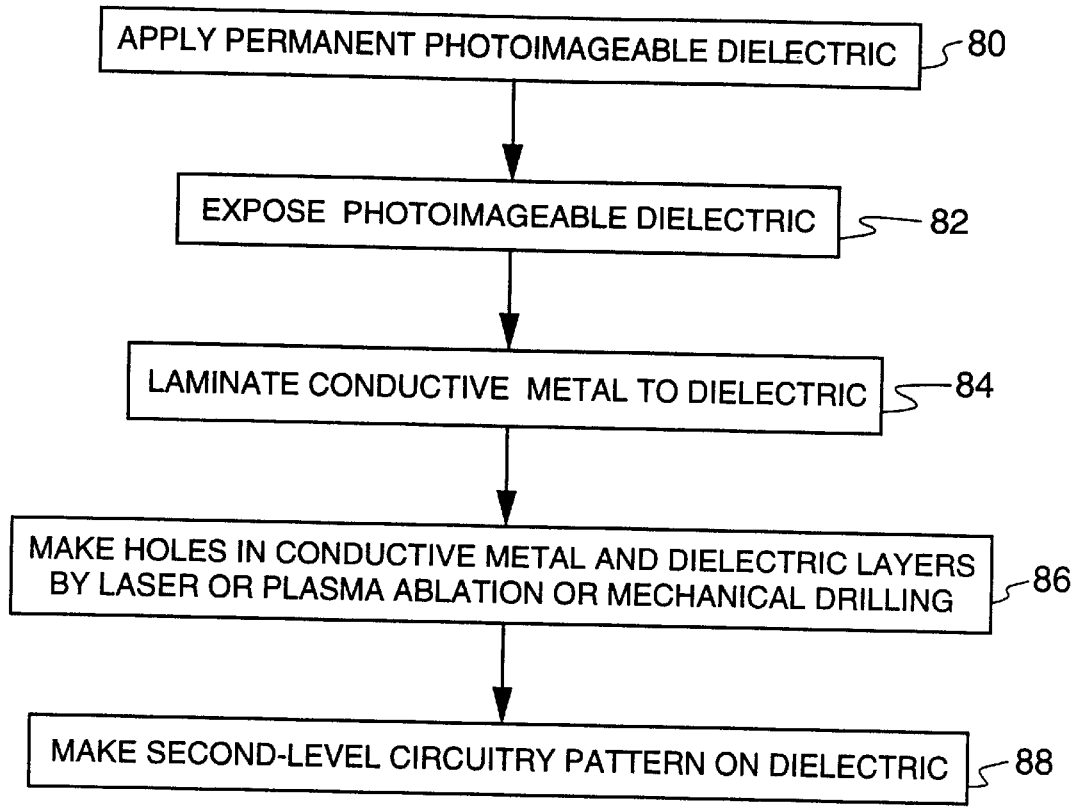
FIG. 5 is a flowchart depicting an exemplary manufacturing process of the present invention.

Referring now to the drawing, in which like reference numerals refer to like elements throughout, FIG. 2 shows a cross-sectional exploded view, and FIGS. 3 and .4 show cross-sectional in-process and completed side views, respectively, of a two-layer circuit board 10' manufactured in accordance with the present invention. FIG. 5 depicts a flowchart showing exemplary process steps according to the invention.

Circuit board 10' may have a first-level circuitry pattern 14' on one or both of top side 22 and bottom side 24 of substrate 12, as shown in FIG. 2. Dielectric layer 16' comprises a permanent photoimageable dielectric such as Morton DynaVia 2000 cationically cured epoxy. The permanent photoimageable dielectric may be positive acting or negative acting and may be any photoimageable dielectric known in the art. Examples of such photoimageable dielectrics include, but are not limited to, products sold under the following trade names: PSR 4000 soldermask (Taiyo Ink), Vacrel® acrylate epoxy (DuPont), Probelec™ 7081 cationically cured epoxy (Ciba), MacuVia™ (MacDermid),or ViaLux™ (DuPont).

Figure 4:
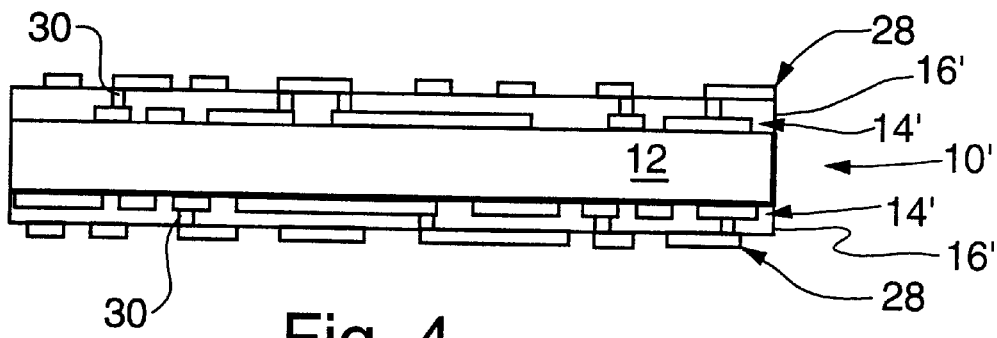
FIG. 4 is an illustration of the circuit board of FIG. 2 after creation of second-level circuitry.

The process for manufacture of circuit board 10' as shown in FIGS. 3 and 4 in accordance with the present invention comprises the steps as depicted in FIG. 5. Beginning with a substrate 12 having a top side 22 and a bottom side 24 and a first-level circuitry pattern 14' on at least one of the sides as shown in FIG. 3, at step 80, a permanent photoimageable dielectric material 16' is applied over the first-level circuitry pattern 14'. The photoimageable dielectric material 16' is then exposed to radiation, such as ultraviolet light, at step 82. Next, at step 84, a conductive metal layer 20', such as a copper foil, is laminated to the dielectric material 16'. Then, at step 86, holes 26 in the conductive metal layer 20' and the dielectric material 16' are fabricated by mechanical drilling or laser or plasma ablation to expose portions of the first-level circuitry pattern 14'. Finally, at step 88, a second-level circuitry pattern 28 is formed on the dielectric material 16', as shown in FIG. 4, and conductive material 30 is placed in holes 26 to establish electrical connection between the second-level circuitry pattern 28 and the first-level circuitry pattern 14'.

The preferred method of applying dielectric layer 16' is by vacuum lamination of a dry film of permanent photoimageable dielectric such as Morton DynaVia 2000. Curtain, screen, or roller application techniques may also be used. Depending on the dielectric material used, the first-level circuitry 14' may require a surface treatment before application of dielectric layer 16'. For instance, for a dielectric layer 16' comprising Morton DynaVia 2000, a copper oxide process of first-level circuitry 14' is required.

Before exposure to radiation, the photoimageable dielectric 16' may require a drying step to remove any residual solvent. When a dry photoimageable dielectric film is applied by the preferred vacuum lamination technique, no further drying is necessary.

The method for exposure of the photoimageable dielectric 16' to radiation depends upon the method to be used for fabricating holes 26. When laser, plasma, or conventional mechanical mechanisms are used to fabricate holes 26, the radiation exposure step is a blanket exposure. When photoimaging techniques are used to fabricate the holes, the radiation exposure step may be a patterned exposure that creates a pattern corresponding to the holes.

Conductive metal layer 20' may be a metal foil, such as copper foil or a copper-aluminum laminate, having a thickness greater than about 8.75 microns (or ¼ ounce/square foot), preferably between about 8.75 and about 17.5 microns (¼–½ ounce/square foot).

As with the radiation exposure step, the conditions under which the conductive metal layer 20' is laminated to the dielectric layer 16' are dependent upon the fabrication technique for holes 26. Generally, the lamination step is conducted at a pressure of about 0 to about 500 pounds per square inch for approximately 30 minutes to approximately 3 hours. When photoimaging hole-forming techniques are used, the conductive metal layer 20' lamination step 84 is carried out at a temperature of about 90° C. to about 125° C. When laser, plasma, or mechanical hole-forming techniques are used, a higher temperature in the range of about 180° C. to about 200° C. is used to fully cure the photoimageable dielectric. In each case, however, the lamination step is of sufficient pressure, time, and temperature to planarize dielectric material 16'.

Before ablating holes 26, conductive metal layer 20' may be thinned to a 3 to 5 micron thickness by a uniform, blanket etch step, such as by FluidHead™ technology, as is well known in the art. If a copper-aluminum laminate is used, the aluminum is removed in this step. Lamination of a thicker foil allows easier handling without damaging the foil. Subsequent thinning provides the lightweight conductive layer desired for fine-line circuitry.

With or without a thinning step, the step 86 of making holes 26 may comprise mechanically drilling or laser or plasma ablating both conductive metal layer 20' and dielectric layer 16' simultaneously. Alternatively, holes 26 in conductive metal layer 20' may be fabricated by dot-etching the conductive metal layer 20' in a pre-defined pattern to define the holes 26 and uncover dielectric layer 16' underneath. Holes 26 in the dielectric layer 16' may then be fabricated by laser or plasma ablation, by conventional mechanical drilling, or if the underlying dielectric was pattern exposed in step 82, the dielectric may be developed out from under conductive metal layer 20' using a suitable developer such as butyrolactone or propylene carbonate. If the holes 26 are fabricated by a photoimaging developing step in step 86, a post-cure step may be required at about 180° C. to about 200° C. for approximately 90 minutes to approximately 3 hours.

In the alternative, the process may comprise a blanket exposure to radiation in step 82, a low temperature lamination (90° C. to 125° C.) in step 84 followed by a thinning step, and fabrication of the holes 26 in step 86 by a dot etch of the conductive metal layer 20' followed by a very aggressive etching step, such as a de-smear step, of dielectric layer 16', followed by a post-cure at 180° C. to 200° C.

Figure 6:
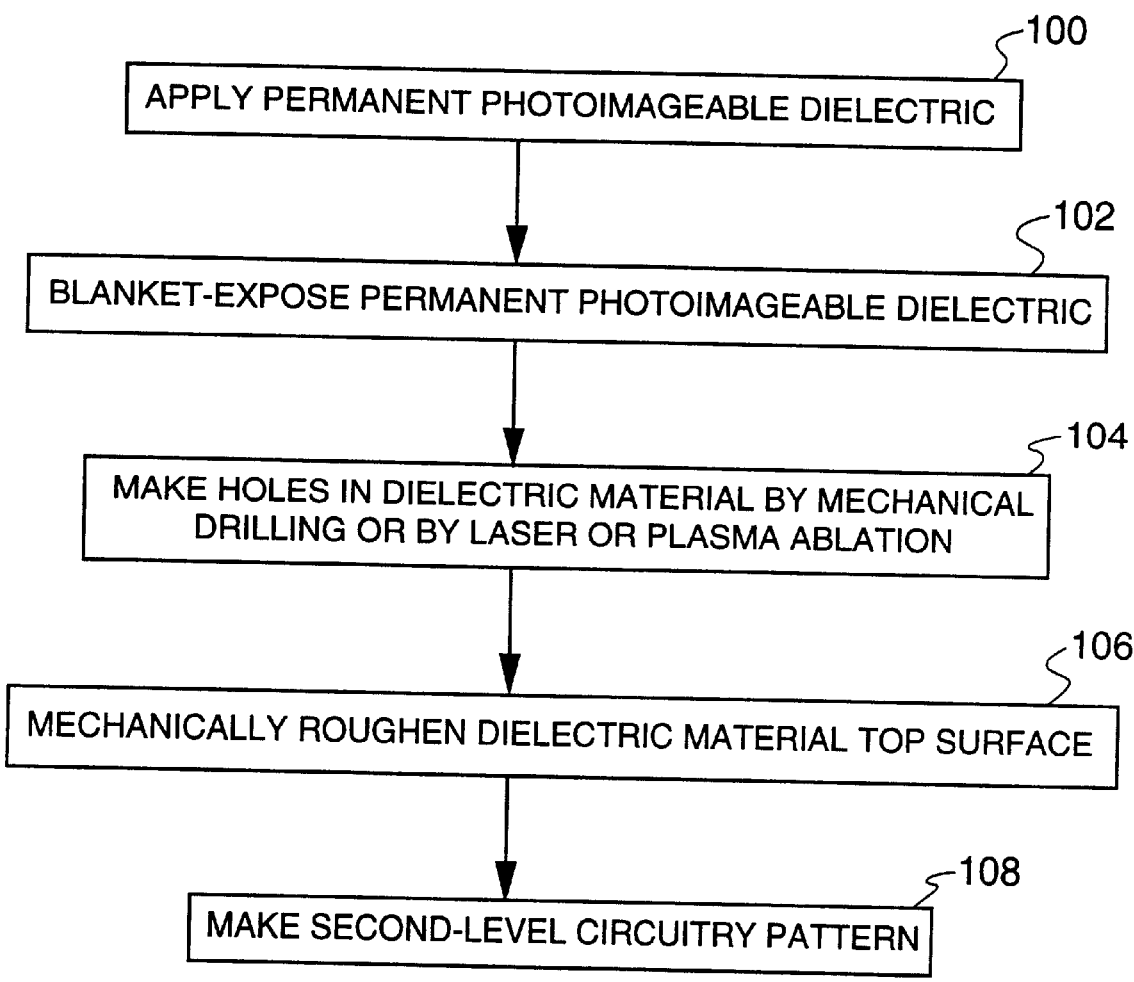
FIG. 6 is a flowchart depicting another exemplary manufacturing process of the present invention.

In yet another alternative, conductive metal layer 20' may be completely etched away to leave a planar, micro-roughened replicate dielectric surface. Holes 26 in dielectric layer 16' may then be fabricated by mechanical drilling or laser or plasma ablation. Referring now to the flowchart of FIG. 6, rather than applying conductive metal layer 20' and etching it away, permanent photoimageable dielectric layer 16' may be applied at step 100, such as by dry film lamination, screen, roller, or curtain coating, and then blanket cured using appropriate photo-thermal mechanisms at step 102. Holes 26 may be fabricated by mechanical drilling or laser or plasma ablation at step 104, and then, in step 106, the dielectric layer 16' surface may be roughened by a mechanical surface preparation known in the art before creating the second-layer circuitry pattern in step 108.

For any of the processes described above, depending on circuit requirements, second-level circuitry 28 may be patterned by copper plate-up techniques, such as full panel plating followed by subtractive circuitization, flash plating followed by pattern plating, fully additive pattern plating, and semi-additive pattern plating.

The preferred method of laminating a dry film permanent photoimageable dielectric layer 16', such as Morton Dyna-Via 2000, in step 80 and laminating a conductive metal layer 20' to the dielectric in step 84 offers certain advantages. Laminated copper foil-to-Morton DynaVia 2000 adhesion has been shown to be superior to plated copper-to-Morton DynaVia 2000 adhesion. Mechanical surface preparation of dielectric layer 16' before lamination of conductive metal layer 20' is unnecessary. Also, because the vacuum lamination step keeps the permanent photoimageable dielectric drier than a wet process surface preparation followed by immersion in an aqueous plating bath, dielectric layer 16' maintains a moisture content below a critical concentration at which the copper-dielectric interface may be prone to blistering.

A significant advantage to manufacturing a multi-layer circuit board by the steps of the present invention is that such a circuit board is especially well-suited for development of new multi-layer circuit board products. The circuit board 10' made by the process of the present invention facilitates a further process of the present invention for product development of multi-layer circuit boards.

Figure 7:
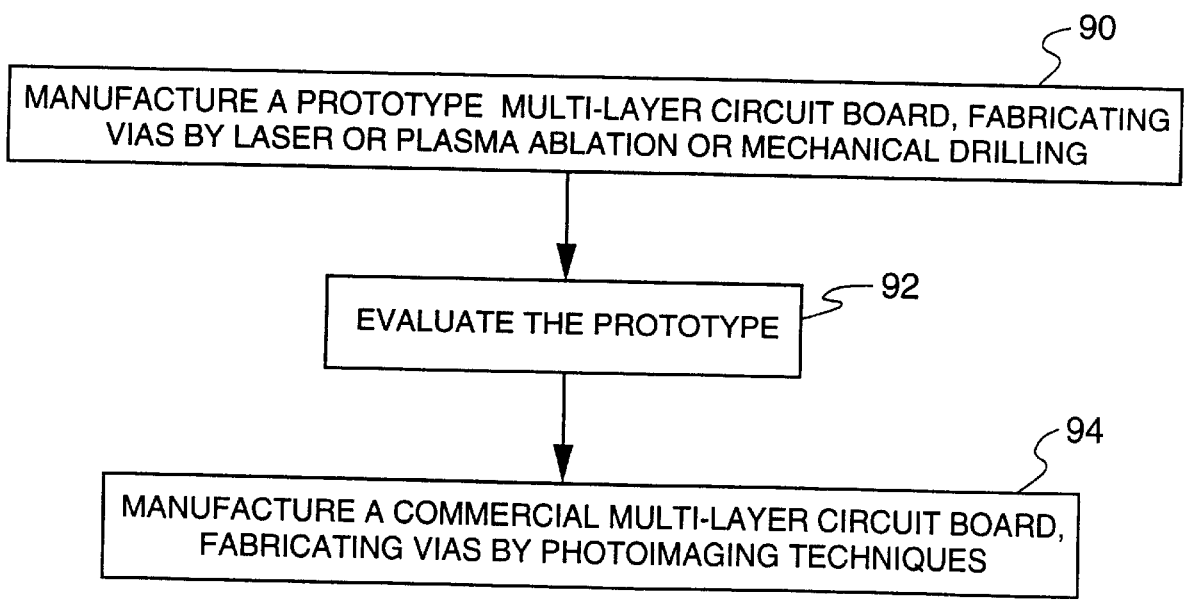
FIG. 7 is a flowchart depicting an exemplary product development process of the present invention.

Referring now to FIG. 7, the product development process according to the present invention is illustrated. The process comprises in step 90 first making a prototype multi-layer circuit board 10' having a structure comprising substrate 12, a first-level circuitry pattern 14' on at least one side, a permanent photoimageable dielectric layer 16' over the first-level circuitry pattern 14', a conductive metal layer 20' further comprising a second-level circuitry pattern 28 over the dielectric layer 16', and a plurality of vias or holes 26 containing a conductive material 30 that electrically connects the second-level circuitry with the first-level circuitry. The vias 26 in the prototype multi-layer circuit board are fabricated by laser or plasma ablation or mechanical drilling. Then, in step 92, the prototype is evaluated, such as by a potential customer who gathers test data. Finally, in step 94, a commercialized multi-layer circuit board is made having a structure and materials of construction identical to the prototype multi-layer circuit board 10'. The vias 26 in the commercialized multi-layer circuit board, however, are fabricated by photoimaging techniques advantageous for mass production of boards, such as described above.

The present invention thus comprises a multi-layer circuit board 10' comprising a substrate 12 having a top side 22 and a bottom side 24; a first-level circuitry pattern 14' on at least one of the sides; a dielectric layer 16' over the first-level circuitry pattern 14'; a conductive metal layer 20' over the dielectric layer 16' further comprising a second-level circuitry pattern 28; and a plurality of vias or holes 26 containing a conductive material 30 that electrically connects the second-level circuitry to the first-level circuitry, wherein the dielectric layer 16' is suitable for fabrication of vias both by laser or plasma ablation or mechanical drilling techniques and by photoimaging techniques.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for developing a commercial multi-layer circuit board, the process comprising the steps of:
   (a) making a prototype multi-layer circuit board,
      said prototype multi-layer circuit board having a structure comprising a substrate having a top side and a bottom side, a first-level circuitry pattern on at least one of said sides, a layer of permanent photoimageable dielectric material over said first-level circuitry pattern, a layer of conductive metal having a second-level circuitry pattern over said layer of permanent dielectric material, and vias in said layer of permanent dielectric material, said vias containing conductive material that electrically connects said second-level circuitry pattern with said first-level circuitry pattern,
      by a method comprising, in order, the steps of:
         (i) applying said layer of permanent photoimageable dielectric material over said first-level circuitry pattern,
         (ii) blanket exposing said layer of permanent photoimageable dielectric material to radiation,
         (iii) laminating said layer of conductive metal to said layer of dielectric material,
         (iv) making holes in said layer of conductive metal to uncover portions of said dielectric material and making holes in said layer of permanent dielectric material to uncover portions of said first-level circuitry pattern by a method selected from the group consisting of laser ablation, plasma ablation, and mechanical drilling, and
         (v) making said second-level circuitry pattern on said layer of dielectric material including placing said conductive material in said holes and forming said vias;
   (b) evaluating said prototype; and
   (c) making the commercial multi-layer circuit board,
      said commercial multi-layer circuit board having a structure and materials of construction identical to said prototype multi-layer circuit board, by a method comprising, in order, the steps of:
         (i) applying a layer of said permanent photoimageable dielectric material over said first-level circuitry pattern,
         (ii) pattern exposing said layer of permanent photoimageable dielectric material to radiation and forming a pattern for said holes,
         (iii) developing away unexposed regions of said layer of permanent photoimageable dielectric material and forming said holes,
         (iv) curing said layer of permanent photoimageable dielectric material,
         (v) roughening the surface of said layer of permanent photoimageable dielectric material,
         (vi) plating a layer of said conductive metal onto said layer of permanent dielectric material, and
         (vii) etching said layer of conductive material and forming said second-level circuitry pattern.

2. The process of claim 1 in which, in step (a)(iv), said holes are formed by laser ablation.

3. The process of claim 1 in which step (a)(iii) comprises laminating said conductive metal layer at a temperature of about 180° C. to about 200° C., for about 30 minutes to about 3 hours, at a pressure of about 0 to about 500 pounds per square inch.

4. The process of claim 1 in which said conductive metal layer comprises a copper foil having a thickness greater than about 8.75 microns.

5. The process of claim 4 in which in said conductive metal layer comprises a copper foil having a thickness of between about 8.75 and about 17.5 microns.

6. The process of claim 4 in which step (a)(iv) further comprises thinning said conductive metal layer prior to making said holes.

7. The process of claim 6 in which the thinning step comprises completely etching away said conductive metal layer to leave the dielectric material with a micro-roughened surface.

8. The process of claim 1 in which said permanent photoimageable dielectric comprises a dry film.

9. The process of claim 1 in which step (a)(iii) comprises laminating said conductive metal layer at sufficient temperature and pressure and for a time sufficient to planarize the dielectric material.

10. The process of claim 1 in which step a(iv) comprises simultaneously making said holes in both said conductive metal layer and said dielectric material by mechanical drilling, by laser ablation, or by plasma ablation.

11. The process of claim 10 in which, in step (a)(iv), said holes are formed by laser ablation.

12. The process of claim 8 in which, in step (a)(iv), said holes are formed by laser ablation.

13. The process of claim 8 in which the developer used in step (c)(iii) is butyrolactone or propylene carbonate.

14. The process of claim 1 in which step (a)(iii) comprises laminating said conductive metal layer to said dielectric material at about 90° C. to about 125° C. for about 30 minutes to about 3 hours at a pressure of about 0 to about 500 pounds per square inch; and step (a)(iv) further comprises thinning said conductive metal layer prior to making said holes, making holes in said conductive layer by dot-etching, and making holes in said dielectric layer by an aggressive etching step; further comprising after step (a)(iv), conducting a post-cure treatment at a temperature of about 180° C. to about 200° C., for about 30 minutes to about 3 hours, at a pressure of about 0 to about 500 pounds per square inch.

15. The process of claim 1 in which step (a)(iii) comprises laminating said conductive metal layer at a temperature of about 90° C. to about 125° C., for about 30 minutes to about 3 hours, at a pressure of about 0 to about 500 pounds per square inch, and further comprising after step (c)(iv), conducting a post-cure treatment at a temperature of about 180° C. to about 200° C., for about 30 minutes to about 3 hours, at a pressure of about 0 to about 500 pounds per square inch.

16. A process for developing a commercial multi-layer circuit board, the process comprising the steps of:
   (a) making a prototype multi-layer circuit board,
      said prototype multi-layer circuit board having a structure comprising a substrate having a top side and a bottom side, a first-level circuitry pattern on at least one of said sides, a layer of permanent photoimageable dielectric material over said first-level circuitry pattern, a layer of conductive metal having a second-level circuitry pattern over said layer of permanent dielectric material, and vias in said layer of permanent dielectric material, said vias containing conductive material that electrically connects said second-level circuitry pattern with said first-level circuitry pattern,
      by a method comprising, in order, the steps of:
         (i) applying said layer of permanent photoimageable dielectric material over said first-level circuitry pattern,
         (ii) blanket exposing said layer of permanent photoimageable dielectric material to radiation, (iii) laminating said layer of conductive metal to said layer of dielectric material, (iv) making holes in said layer of conductive metal to uncover portions of said dielectric material and making holes in said layer of permanent dielectric material to uncover portions of said first-level circuitry pattern by a method selected from the group consisting of laser ablation, plasma ablation, and mechanical drilling, and (v) making said second-level circuitry pattern on said layer of dielectric material including placing said conductive material in said holes and forming said vias;

(b) evaluating said prototype; and (c) making the commercial multi-layer circuit board having a structure and materials of construction identical to said prototype multi-layer circuit board, but wherein making said commercial multi-layer circuit board includes forming said holes by a photoimaging technique.

17. The process of claim 16 in which step (a)(iii) comprises laminating said conductive metal layer to said dielectric material at about 90° C. to about 125° C. for about 30 minutes to about 3 hours at a pressure of about 0 to about 500 pounds per square inch; and step (a)(iv) further comprises thinning said conductive metal layer prior to making said holes, making holes in said conductive layer by dot-etching, and making holes in said dielectric layer by an aggressive etching step; further comprising after step (a)(iv), conducting a post-cure treatment at a temperature of about 180° C. to about 200° C., for about 30 minutes to about 3 hours, at a pressure of about 0 to about 500 pounds per square inch.

18. The process of claim 16 in which, in step (a)(iv), said holes are formed by laser ablation.

19. The process of claim 16 in which step (a)(iii) comprises laminating said conductive metal layer at sufficient temperature and pressure and for a time sufficient to planarize the dielectric material.

20. The process of claim 16 in which step (a)(iv) comprises simultaneously making said holes in both said conductive metal layer and said dielectric material by mechanical drilling, by laser ablation, or by plasma ablation.

21. The process of claim 16 which said permanent photoimageable dielectric comprises a dry film.

* * * * *